(12) United States Patent
Ovshinsky

(10) Patent No.: US 8,111,546 B2
(45) Date of Patent: Feb. 7, 2012

(54) OPTICAL OVONIC THRESHOLD SWITCH

(75) Inventor: Stanford R. Ovshinsky, Bloomfield Hills, MI (US)

(73) Assignee: Ovonyx, Inc., Troy, MI (US)

( * ) Notice: Subject to any disclaimer, the term of this patent is extended or adjusted under 35 U.S.C. 154(b) by 452 days.

(21) Appl. No.: 12/269,901

(22) Filed: Nov. 13, 2008

(65) Prior Publication Data

US 2010/0117040 A1 May 13, 2010

(51) Int. Cl.
*G11C 11/00* (2006.01)
(52) U.S. Cl. .................. 365/163; 365/148; 977/754
(58) Field of Classification Search .............. 365/46, 365/94, 100, 113, 129, 148, 163; 257/2–5, 257/9, 296, 310, E21.35, E31.047, E27.006; 438/29, 95, 96, 166, 135, 240, 785, 259, 438/365, 482, 486, 597; 977/754
See application file for complete search history.

(56) References Cited

U.S. PATENT DOCUMENTS

| | | | | |
|---|---|---|---|---|
| 5,335,219 A | * | 8/1994 | Ovshinsky et al. | 369/288 |
| 5,341,328 A | * | 8/1994 | Ovshinsky et al. | 365/163 |
| 5,359,205 A | * | 10/1994 | Ovshinsky | 257/3 |
| 5,414,271 A | * | 5/1995 | Ovshinsky et al. | 257/3 |
| 5,534,712 A | * | 7/1996 | Ovshinsky et al. | 257/3 |
| 5,596,522 A | * | 1/1997 | Ovshinsky et al. | 365/113 |
| 2006/0118774 A1 | * | 6/2006 | Ovshinsky | 257/8 |
| 2007/0133272 A1 | * | 6/2007 | Yu et al. | 365/163 |

* cited by examiner

*Primary Examiner* — Richard Elms
*Assistant Examiner* — Harry W Byrne
(74) *Attorney, Agent, or Firm* — Kevin L. Bray

(57) ABSTRACT

A method and device for accomplishing transformation of a switching material from a resistive state to a conductive state. The method utilizes a non-electrical source of energy to effect the switching transformation. The switching material may be a chalcogenide switching material, where the non-electrical source of energy initiates switching by liberating lone pair electrons from bound states of chalcogen atoms. The liberated lone pair electrons form a conductive filament having the characteristics of a solid state plasma to permit high current densities to pass through the switching material. The device includes a switching material with electrical contacts and may be interconnected with other elements in a circuit to regulate electrical communication therebetween.

15 Claims, 1 Drawing Sheet

OPTICAL OVONIC THRESHOLD SWITCH

FIELD OF INVENTION

This invention relates to methods and devices useful for the processing of information. More particularly, this invention relates to methods and devices for electronic switching. Most particularly, this invention relates to methods and devices for the optical excitation of electronic switching.

BACKGROUND OF THE INVENTION

There is a continuing need to improve the performance of computers to meet the needs of new and more sophisticated computing applications. Applications such as pattern classification, pattern association, associative memory, speech, and character recognition remain largely unamenable to solution or implementation by current computers. Many simple tasks performed readily and intuitively by humans and other biological organisms are also beyond the capabilities of conventional computers.

The desire to expand the frontiers of computer science has motivated a consideration of the factors that contribute to the limitations of current computers. Silicon is at the heart of today's computer. The advances in computing power and speed over the years have largely been a consequence of better understanding the fundamental properties of silicon and harnessing those properties for practical effect. Initial progress was predicated on building basic electronic components such as transistors and diodes out of silicon, and later progress followed from the development of integrated circuits. More recent advances represent a continuation of these trends and currently emphasize miniaturization and integration of an ever-larger number of microelectronic devices on a single chip. Smaller devices lead to higher memory storage densities, more highly integrated circuits and faster computers.

Since future improvements in computing power and functionality are currently predicated on further improvements in silicon technology, there has been much recent discussion about the prognosis for continued miniaturization of silicon-based electronic devices. A growing consensus is emerging that believes that the computer industry is rapidly approaching the performance limits of silicon. The feature size in today's manufacturing technologies is 0.13 micron and it is expected that this can be reduced to about 0.08 micron in the future. Further decreases in feature size, however, are deemed problematic because smaller dimensions lead to a change in the fundamental behavior of silicon. More specifically, as the dimensions of silicon devices decrease to tens of nanometers and below, silicon enters the quantum regime of behavior and no longer functions according to the classical physics that governs macroscopic objects. In the quantum regime, energy states are quantized rather than continuous and phenomena such as tunneling lead to delocalization of electrons across many devices. Consequences of tunneling include leakage of current as electrons escape from one device to neighboring devices and a loss of independence of devices as the state of one device influences the state of neighboring devices. In addition to fundamental changes in the behavior of silicon, further decreases in the dimensions of silicon devices also pose formidable technological challenges. New and costly innovations in fabrication methods such as lithography will be needed to achieve smaller feature sizes.

One strategy for advancing the capabilities of computers is to identify materials other than silicon that can be used as the active medium in data processing, logic or memory applications. Such alternative computing media could be used independent of or in combination with silicon to form the basis of a new computing paradigm that seeks to offer better performance and more convenient manufacturing than is possible with silicon.

The instant inventor has recently proposed the use of chalcogenide phase change materials as an active material for the processing and storage of data. In U.S. Pat. No. 6,671,710 (the '710 patent), the disclosure of which is hereby incorporated by reference herein, Ovshinsky et al. describe a principle of operation of phase change materials in computing applications. Phase change materials not only operate in the binary mode characteristic of conventional silicon computers, but also offer opportunities for the non-binary storage and processing of data. Non-binary storage provides for high information storage densities, while non-binary processing provides for massively parallel operation. The '710 patent also describes algorithms that utilize a non-binary computing medium for mathematical operations such as addition, subtraction, multiplication and division. U.S. Pat. Nos. 6,714,954; 6,963,893; and 7,440,990 by Ovshinsky et al., the disclosures of which are hereby incorporated by reference, describe further mathematical operations based on a phase change computing medium. These operations including factoring, modular arithmetic and parallel operation.

In U.S. Pat. No. 6,999,953, the disclosure of which is hereby incorporated by reference, Ovshinsky considers the architecture of computing systems based on devices utilizing chalcogenide materials as the active computing medium or to regulate signal transmission. More specifically, Ovshinsky considers networks of chalcogenide computing and switching devices and demonstrates functionality that closely parallels that of biological neural networks. Important features of this functionality include the accumulative response of phase change computing devices to input signals from a variety of sources, an ability to weight the input signals and a stable, reproducible material transformation that mimics the firing of a biological neuron. This functionality enables a new concept in intelligent computing that features learning, adaptability, and plasticity.

In U.S. Pat. Nos. 6,967,344; (the '344 patent); 6,969,867; (the '867 patent); 7,227,170 (the '170 patent); 7,227,221 ('221 patent), and 7,186,998 ('998 patent), the disclosures of which are hereby incorporated by reference herein, Ovshinsky et al. further develop the notion of chalcogenide computing by discussing additional computing, storage, and processing devices. The '344 patent discusses a multi-terminal chalcogenide switching device where a control signal provided at one electrical terminal modulates the current, threshold voltage or signal transmitted between other electrical terminals through the injection of charge carriers. The '867 patent describes a related multi-terminal switching device that utilizes a field effect terminal to modulate the current, threshold voltage or signal transmitted between other terminals. The devices described in the '344 and '867 patents may be configured to provide functionality analogous to that of the transistor that is so vital to silicon-based computers. The '170, '221, and '998 patents present multiple-bit storage and logic devices that utilize a chalcogenide phase-change material in a multi-terminal device design.

In U.S. Pat. No. 7,085,155, Ovshinsky et al. demonstrated a device for securing data in a chalcogenide computing system. The security device exploits the variable resistivity of the phase-change material and provides a parallel circuit combination that regulates the resistance of surrounding elements in different ways for authorized and unauthorized reads of the phase-change device. The circuit combination may include a parallel combination of a chalcogenide phase-change material and a chalcogenide switching material. U.S. Pat. No. 7,186,999 by Ovshinsky et al. provides an error reduction circuit for phase-change computing based on series-parallel circuit combinations of chalcogenide devices arranged in an array, where a chalcogenide switching device may be used as an access device.

The foregoing work by Ovshinsky et al. provides a concept, operating principles and basic devices that enable a computing paradigm based in whole or in part on chalcogenide materials. In order to further the realization of chalcogenide computing as a viable complement to or alternative to silicon-based technologies, it is desirable to expand the range of devices and functionality available from chalcogenide phase change materials. Of greatest interest are devices capable of performing operations necessary for the processing and storage of data as well as systems that regulate signal transmission and access to devices. Of particular interest in enabling higher speed operation is an extension of chalcogenide computing beyond purely electrical operation to hybrid electrical-optical or pure optical operation.

SUMMARY OF THE INVENTION

This invention provides a method and device for electronic switching based on chalcogenide and related switching materials. The method includes exciting a switching material with a non-electrical source. In one embodiment, the non-electrical source is an electromagnetic source and the switching material is a chalcogenide material, where the electromagnetic source provides energy that initiates a transformation of the chalcogenide switching material from a resistive state to a conductive state. The method exploits the unique importance of lone pair electrons in the chalcogenide switching material. The electric field of the electromagnetic source couples with the lone pair electrons to create a conductive filament of unbound carriers within an otherwise resistive material. By controlling the intensity of the electromagnetic source, the cross-sectional area of the conductive filament can be varied and high conductivity over a wide range of current densities can be achieved.

In one embodiment, the device includes a non-electrical source of energy, a switching material, and two electrical contacts connected to the switching material. The electrical contacts connect the electrical switching material to other elements within an electrical circuit. When the non-electrical source of the device is turned on, a resistive-conductive transformation of the switching material is induced and a conductive pathway between circuit elements interconnected with the switching material is formed. When the non-electrical source is turned off, the conductive pathway is destroyed and signal transmission between the interconnected circuit elements is blocked.

In another embodiment, the invention provides a method for reflecting or filtering electromagnetic radiation. In this embodiment, a conductive filament is formed in a switching material by inducing a switching transformation electrically, with electromagnetic radiation, or with another non-electrical form of energy. The conductive filament includes a high concentration of free charge carriers, preferably free electrons. The free carriers are capable of absorbing electromagnetic radiation. When incident electromagnetic radiation is directed to the switched material, the free carriers of the conductive filament absorb or reflect a portion of the wavelength spectrum. Wavelengths outside of the absorbed range pass through the switching material. By controlling the state of the switching material, wavelengths within the absorbed range can be selectively transmitted or blocked. The method thus provides a way to direct, filter or attenuate electromagnetic radiation.

DETAILED DESCRIPTION OF THE ILLUSTRATED EMBODIMENTS

Figure 1:
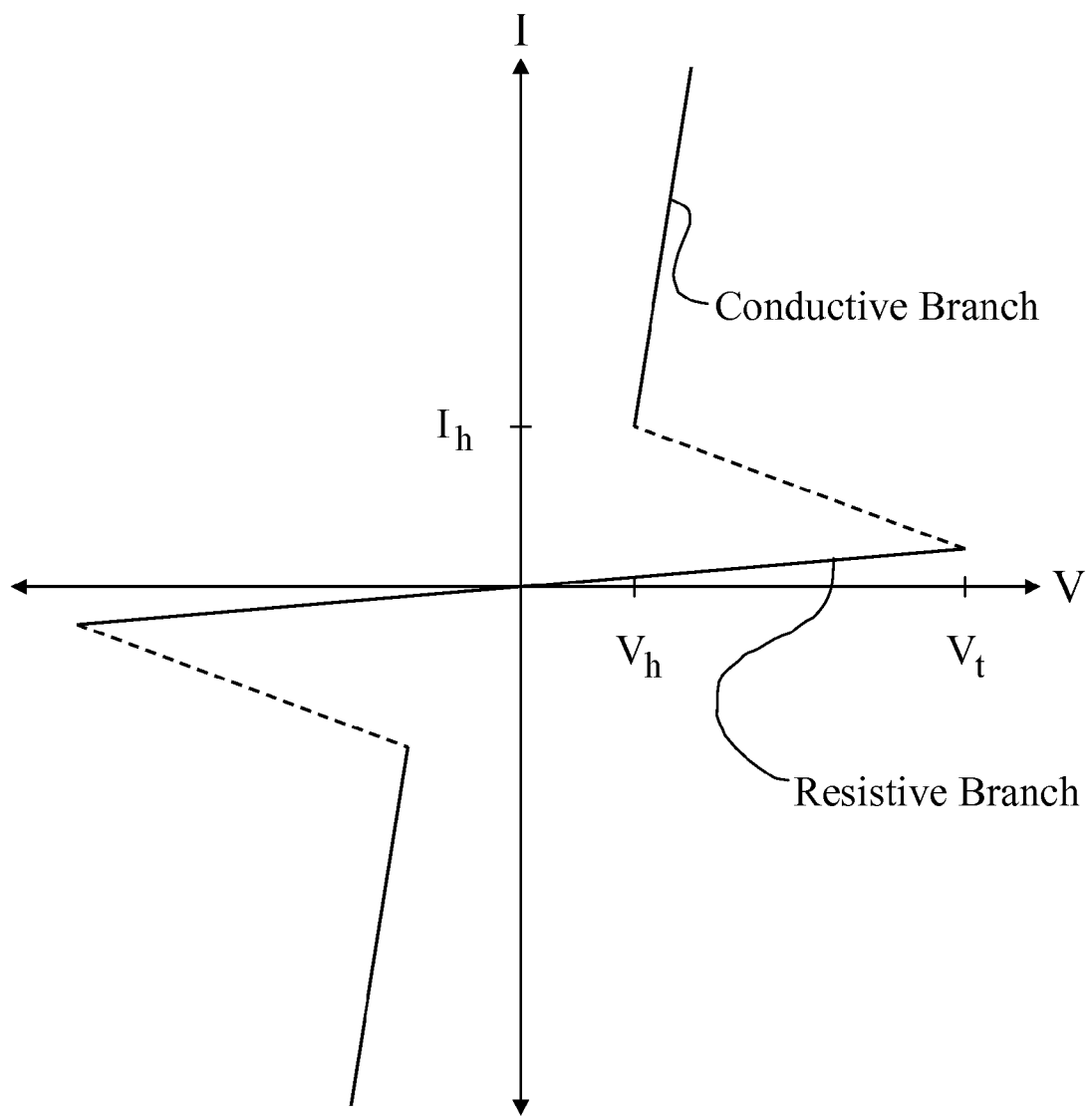
FIG. 1 is a depiction of the I-V characteristics of a switching material that exhibits a transformation from a resistive state to a conductive state upon application of a threshold voltage.

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

The instant invention provides a method and device for initiating a transformation of an active material from an electrically resistive state to an electrically conductive state using a non-electrical source of energy. The active material may be referred to herein as a switching material. Among the important switching materials are the chalcogenide switching materials, also known as Ovonic threshold switching or OTS materials. The electrically-induced switching characteristics of OTS materials have been described in U.S. Pat. Nos. 5,543,737; 5,694,146; and 5,757,446; the disclosures of which are hereby incorporated by reference, as well as in several journal articles including "Reversible Electrical Switching Phenomena in Disordered Structures", Physical Review Letters, vol. 21, p. 1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are hereby incorporated by reference. A brief summary of the electrically-induced switching properties of chalcogenide materials follows. Although the discussion focuses on chalcogenide switching materials, the general principles apply equally to all classes of switching materials.

The electrically-induced switching properties of chalcogenide switching materials are normally depicted in terms of the I-V (current-voltage) response of the material. The I-V response shows the current variation of a chalcogenide material as a function of applied voltage. The I-V response of a chalcogenide switching material exhibits an electrically-induced switching event in which the chalcogenide material undergoes a transformation from a more resistive state to a more conductive state. A schematic depiction of the electrically-induced switching event is presented in FIG. 1. The depiction of FIG. 1 corresponds to a two-terminal device configuration in which two spacedly-disposed electrodes are in contact with a chalcogenide switching material. The I-V curve of FIG. 1 shows the current passing through the switching material as a function of the voltage applied across the material by the electrodes. The I-V characteristics of the material are symmetric with respect to the polarity of the applied voltage. For convenience, we consider the first quadrant of the I-V plot of FIG. 1 (the portion in which current and voltage are both positive) in the discussion of chalcogenide switching behavior that follows. An analogous description that accounts for polarity applies to the third quadrant of the I-V plot.

The I-V curve includes a resistive branch and a conductive branch. The branches are labeled in FIG. 1. The resistive branch corresponds to the regime in which the current passing through the material is a weak function of the applied voltage across the material. This branch exhibits a small slope in the I-V plot and appears as a nearly horizontal line in the first and third quadrants of FIG. 1. The conductive branch corresponds to the regime in which the current passing through the material is highly sensitive to the voltage applied across the material. This branch exhibits a large slope in the I-V plot and appears as a nearly vertical line in the first and third quadrants of FIG. 1. The slopes of the resistive and conductive branches shown in FIG. 1 are illustrative and not intended to be limiting, the actual slopes will depend on the chemical composition of the chalcogenide switching material, device geometry, circuit configuration, and electrical contacts. Regardless of the actual slopes, the conductive branch exhibits a larger slope than the resistive branch. When device conditions are such that the switching material is described by a point on the resistive branch of the I-V curve, the switching material or device may be said to be in a resistive state. When device conditions are such that the switching material is described by a point on the conductive branch of the I-V curve, the switching material or device may be said to be in a conductive state.

In describing the electrically-induced switching properties of the chalcogenide material, we begin with a device that has no voltage applied across it. When no voltage is applied across the chalcogenide switching material, the material is in a resistive state and no current flows through it. This condition corresponds to the origin of the I-V plot shown in FIG. 1. The chalcogenide switching material remains in a resistive state as the applied voltage is increased, up to a threshold voltage (labeled $V_t$ in the first quadrant of FIG. 1). The slope of the I-V curve for applied voltages between 0 and $V_t$ is small in magnitude, an indication that the chalcogenide material has a high electrical resistance. The high resistance implies low electrical conductivity and as a result, the current flowing through the material increases only weakly as the applied voltage is increased. Since the current through the material is very small, the resistive state of the chalcogenide may be referred to as the OFF state of the material.

When the applied voltage equals or exceeds the threshold voltage, the chalcogenide material transforms (switches) from the resistive branch to the conductive branch of the I-V curve. The switching event occurs essentially instantaneously and is depicted by the dashed line in FIG. 1. Upon switching, the device voltage decreases significantly and the device current becomes much more sensitive to changes in the device voltage. The chalcogenide material remains in the conductive branch as long as a minimum current, labeled $I_h$ in FIG. 1, is maintained. We refer to $I_h$ as the holding current and the associated voltage $V_h$ as the holding voltage of the device. If the device conditions are changed so that the current becomes less than $I_h$, the material normally returns to the resistive branch of the I-V plot and requires subsequent application of a threshold voltage to resume operation on the conductive branch. If the current is only momentarily (a time less than the recovery time of the chalcogenide material) reduced below $I_h$, the conductive state of the chalcogenide material may be recovered upon restoring the current to or above $I_h$. The recovery time of chalcogenide switching materials has been discussed in the article "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosure of which is incorporated by reference herein.

The switching effect of the instant devices originates from a transformation of the chalcogenide material from a resistive state to a conductive state upon application of a threshold voltage, $V_{th}$. According to one model of the switching transformation, application of the threshold voltage causes the formation of a conductive channel or filament within the chalcogenide material. At the threshold voltage, the electric field experienced by the material is sufficiently high to induce a breakdown or avalanche effect whereby electrons are removed from atoms to form a highly conductive, plasma-like filament of charge carriers. Rather than being bound to atoms, some electrons become unbound and highly mobile. As a result, a conductive channel or filament forms. The lone pair electrons of the chalcogen (column VI) element are believed to be the primary source of electrons in the conductive filament. The lone pair electrons occupy higher valence orbitals and are more weakly bound to the chalcogen atom than inner core valence electrons. As a result, the lone pair electrons are more readily removed by an applied electric field and are more energetically accessible.

The conductive filament formed upon switching constitutes a conductive volume within the otherwise resistive chalcogenide material. The conductive filament extends through the chalcogenide material between the device terminals and provides a low resistance pathway for electrical current. Portions of the chalcogenide material outside of the filament remain resistive. Since electric current traverses the path of least resistance, the presence of a conductive filament renders the chalcogenide material conductive and establishes a conductive state. The creation of a conductive filament is the event that underlies the switching of the chalcogenide material from a resistive state to a conductive state.

The conductive filament is maintained between the device terminals as long as the device current remains at or above the holding current. A conductive filament is present for all points along the conductive branch, but the cross sectional area of the filament may differ for different points along the conductive branch. Depending on operating conditions within the conductive branch, the filament can be narrow or wide. As the applied voltage is increased along the conductive branch, the cross section of the filament is enlarged as the applied voltage is increased. The enlarged filament indicates a greater volume of the chalcogenide material exhibits high conductivity. As a result, the chalcogenide material can support a greater current, as indicated by the conductive branch of the I-V curve, when the applied voltage increases. Variations of the voltage applied to a chalcogenide material operating in the conductive branch modify the width or thickness of the filament in directions lateral to the direction of current flow. The net effect of varying the applied voltage of a chalcogenide material operating in the conductive branch is to modify the volume fractions of the conductive and resistive portions.

Chalcogenide materials of many chemical compositions undergo the foregoing switching effect. Representative chalcogenide materials are those that include one or more elements from column VI of the periodic table (the chalcogen elements) and optionally one or more chemical modifiers from columns III, IV or V. One or more of S, Se, and Te are the most common chalcogen elements included in the active material of the instant devices. The chalcogen elements are characterized by divalent bonding and the presence of lone pair electrons. The divalent bonding leads to the formation of chain and ring structures upon combining chalcogen elements to form chalcogenide materials and, as noted above, the lone pair electrons provide a source of electrons for forming a conducting filament. Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and leads to a broad classification of chalcogenide materials, according to their ability to undergo crystallization or other structural rearrangements, into one of two types: threshold switching materials and phase-change (or memory) materials.

Both types of chalcogenide materials display the switching behavior shown in FIG. 1, but differ in their structural response to filament formation. The threshold switching materials generally possess a higher concentration of modifiers and are more highly crosslinked than the phase-change materials. They are accordingly more rigid structurally. Threshold switching materials are amorphous and show little or no tendency to crystallize because the atomic rearrangements required to nucleate and grow a crystalline phase are inhibited by the rigidity of the structure. Threshold switching materials do not undergo a crystallization transformation during switching and remain amorphous upon removing the applied voltage after switching.

In one embodiment of the instant invention, the switching material includes Se or Te. In another embodiment, the atomic concentration of Se or Te in the switching material is at least 30%. In a further embodiment, the atomic concentration of Se or Te in the switching material is at least 50%. As used herein atomic concentration refers to the percent abundance of an element in molar or atomic terms. In the composition $As_2Te_3Ge$, for example, the mole fraction of Te is 0.50 and the atomic concentration of Te is 50%. In another embodiment, the switching material includes Se or Te along with Ge or In. In a further embodiment, the switching material includes Se or Te, Ge or In, and one or more of Si, Sb and As. Representative switching materials include $Si_{14}Te_{39}As_{37}Ge_9X$ (X=In or P), As—Te—Ge—Si alloys, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, and $Si_5Te_{34}As_{28}Ge_{11}S_{21}Se_1$.

Phase-change chalcogenide materials, on the contrary, are lightly crosslinked and more easily undergo full or partial crystallization. An amorphous phase-change material undergoes filament formation in the presence of a threshold voltage as described in FIG. 1 hereinabove. Once in the conductive branch, however, the phase-change material may undergo nucleation and growth of a crystalline phase. The volume fraction of the crystalline phase depends on the magnitude and time of the current passing through the phase-change material. If formed, the crystalline phase is retained upon removing the applied voltage after switching. Through appropriate selection of device operating conditions, the amorphous-crystalline transformation of chalcogenide phase-change memory materials becomes reversible over many cycles. Chalcogenide memory materials have been discussed in U.S. Pat. Nos. 5,166,758; 5,296,716; 5,534,711; 5,536,947; 5,596,522; and 6,087,674; the disclosures of which are hereby incorporated by reference.

The instant invention concerns threshold switching materials and provides a non-electrically-induced method for inducing a transformation of threshold switching material from a resistive state to a more conductive state. The method induces a transformation from a first resistance state to a second resistance state where the second resistance state is more conductive than the first resistance state. In one embodiment, the method induces a transformation of a chalcogenide threshold switching material, such as an Ovonic threshold switching material, from its resistive state to its conductive state as described hereinabove in connection with FIG. 1. The method induces the transformation without effecting a change in the crystalline or amorphous phase volume fraction of the switching material.

In one embodiment, the instant method induces a transformation of an amorphous switching material from a resistive state to a more conductive state via non-electrical means without inducing crystallization of the switching material. In this embodiment, the switching material is amorphous at the onset of the non-electrically-induced switching transformation and remains amorphous during and after the switching process. This embodiment permits transformation of the switching material from one amorphous phase to another amorphous phase.

In another embodiment, the instant method induces a transformation of a crystalline switching material from a resistive state to a more conductive state via non-electrical means without inducing amorphization of the switching material. In this embodiment, the switching material is crystalline at the onset of the non-electrically-induced switching transformation and remains crystalline during and after the switching process. This embodiment permits transformation of the switching material from one crystalline phase to another crystalline phase.

The non-electrical source of energy in accordance with the instant method may be an electromagnetic (e.g. optical), thermal, particle beam, or mechanical source of energy. An electromagnetic source is preferred because it provides greater selectivity. Electromagnetic sources include coherent electromagnetic beams (e.g. laser beams), incoherent electromagnetic beams (e.g. focused lamp or thermal radiator), uncollimated radiation (e.g. unfocussed lamp or radiator), lamps (e.g. tungsten, tungsten-halogen, xenon, mercury, arc-type), and light emitting diodes. An electromagnetic source is tunable in frequency or wavelength, and intensity, to provide selectivity in the energy provided to the switching material. The electromagnetic source provides electromagnetic radiation. The electromagnetic radiation may occur from any portion of the electromagnetic spectrum, including the far-infrared, infrared, visible, ultraviolet, and far-ultraviolet portions of the spectrum.

In the case of a chalcogenide switching material, interactions between an electromagnetic source and the lone pair electrons drive the switching transformation. The electromagnetic source includes oscillating electric and magnetic fields. The electric field couples to lone pair electrons of the chalcogenide material and provides energy to the lone pair electrons to induce the switching transformation. In general, the transfer of energy depends on the frequency of the electromagnetic radiation and occurs when a resonance condition with the lone pair electrons is established. The resonance condition may occur when the frequency of the electromagnetic radiation matches the frequency of an internal electronic or vibrational transition of the lone pair electrons or one or more atoms with which the lone pair electrons are bound to or interact with. In one embodiment, coupling of the electric field and transfer of energy to lone pair electrons occurs through a dipolar mechanism. An oscillating electric field can be viewed as an electric dipole that operates at the frequency of the electromagnetic radiation. When this frequency is in resonance with a frequency of vibration or electronic excitation of a lone pair electron (or an atom or group of atoms with which the lone pair electron is associated), the electric field of the electromagnetic source can transfer energy to the lone pair electron.

Regardless of the underlying mechanism of energy transfer, coupling of the electric field of the electromagnetic source provides energy to the lone pair electrons. When the amount of energy is sufficiently low, the lone pair electrons remain bound to a chalcogen atom and respond to the energy through increased amplitude of oscillation (e.g. a polarization effect) or internal excitation from a low energy bound state to a high energy bound state. When the energy transferred from the electric field of the electromagnetic source to the lone pair electrons increases sufficiently, the lone pair electrons are liberated from the chalcogen atoms to form a conductive filament. The lone pair electrons undergo a transition from a localized bound state to a delocalized unbound state. In the unbound state, the lone pair electrons are no longer associated with a particular chalcogen atom, but rather are mobile. The increased electron mobility associated with liberation of lone pair electrons underlies the transformation of the switching material from its resistive state to its conductive state.

While applied, the electric field of the electromagnetic source extends into the chalcogenide switching material to influence the conductive filamentary portion thereof. The frequency and electric field strength (intensity) of the electromagnetic radiation provided by the electromagnetic source govern the amount of energy transferred to the lone pair electrons and hence control the characteristics of the conductive filament. Variations in the frequency and electric field of the electromagnetic radiation enable modifications of the conductive filament and through modifications of the conductive filament, the current passing through the chalcogenide switching material can be modulated or regulated.

More specifically, at a particular frequency, variations in the electric field strength of the electromagnetic source may expand or contract the conductive filamentary portion. As noted above, expansion of the conductive filamentary portion of the chalcogenide material corresponds to an increase in the volume fraction of the chalcogenide switching material that is in a conductive state, while contraction of the conductive filamentary portion of the chalcogenide material corresponds to a decrease in the volume fraction of the chalcogenide switching material that is in a conductive state. Expansion or contraction effects may be manifested in the diameter, width, cross-sectional area etc. of the conductive portion of the chalcogenide switching material. As the conductive portion expands or contracts, the current carried by, passing through or supported by the chalcogenide switching material changes and is modulated accordingly.

While not wishing to be bound by theory, the instant inventor believes that the electric field strength of the electromagnetic radiation provided by the electromagnetic source varies the cross-section of the conductive filament by influencing the spatial extent over which the conductive filament exists. As noted above, the conductive filament comprises free or unbound charge carriers having high mobility that readily migrate within or through the chalcogenide switching material. An expansion of the conductive filament implies that additional electrons are liberated from the lone pair orbitals of the chalcogenide switching material to become highly mobile. A contraction of the conductive filament implies that some of the electrons in a conductive filament recombine with electron vacancies (holes) in lone pair or bonding orbitals of atoms of the chalcogenide switching material. Upon recombination, the electrons are transformed from unbound states to bound states and lose their mobility.

In order to maintain electrons in the conductive filamentary state, the energy provided by the electromagnetic source needs to be sufficient to insure that the rate of generation of mobile electrons from lone pair orbitals of chalcogen atoms exceeds the rate of recombination of existing mobile electrons back to bound lone pair orbital states. An increase in electric field strength permits the transfer of more energy to the chalcogenide switching material and leads to expansion of the conductive filament through a liberation of lone pair electrons from a greater number of chalcogen atoms extending over a larger volume of the chalcogenide switching material. When the electric field strength is high, the available energy permits the rate of generation of mobile electrons to exceed the rate of recombination of mobile electrons over a larger volume of material and the conductive filament expands. A decrease in electric field strength, in contrast, leads to a contraction of the conductive filament as less energy is available to liberate lone pair electrons and as a result, the recombination process is enhanced relative to the generation process.

When the conductive filament is initially formed at the threshold condition, its cross-section is narrow and the volume fraction of the conductive portion of the chalcogenide switching material is small. While not wishing to be bound by theory, the instant inventor believes that expansion and contraction of an existing conductive filament may occur primarily at the boundary between the conductive filament and the neighboring resistive portion of the chalcogenide switching material. In one model of filament expansion and contraction, the instant inventor envisions a mechanism whereby a dynamic equilibrium occurs at the boundary of the conductive filamentary portion and surrounding resistive portion of the chalcogenide material. In the dynamic equilibrium, the liberation of bound electrons (or generation of free carriers) from lone pair orbitals, bonding orbitals, or defect states to provide conductive, unbound electrons is balanced at the boundary of the filamentary portion and neighboring resistive portion by a recombination of conductive (unbound) electrons with holes (electron vacancies) in lone pair orbitals, bonding orbitals or defect states. As the electric field strength of the electromagnetic radiation increases, the rate of generation increases relative to the rate of recombination. As a result, the filament expands as the boundary extends further into the resistive portion of the chalcogenide switching material. As the electric field strength decreases, the rate of generation decreases relative to the rate of recombination and the filamentary boundary recedes. If the electric field strength is decreased sufficiently, the filament ultimately collapses and the chalcogenide switching material returns to its resistive state.

In the model, filament expansion includes conversion of electrons in lone pair orbitals or bonds of atoms adjacent to the boundary of the filament from a bound state to an unbound state. Generation of unbound electrons may occur through direct promotion of lone pair electrons from bound valence states of a chalcogen atom to an unbound filamentary state or through impact excitation. In the former process, the energy associated with the electric field of the electromagnetic radiation may be absorbed by the chalcogen atom to promote the lone pair electron to an unbound state or may remove the lone pair electron from its bound orbital state through a polarization or breakdown process (e.g. an avalanche process). In the latter process, the energy from the electromagnetic source is transferred to existing conductive electrons to increase their kinetic energy. These energized conductive electrons may subsequently collide with a chalcogen atom in the resistive portion of the chalcogenide switching material adjacent to the boundary of the filament to eject a lone pair electron through an impact ionization process.

The frequency of the electromagnetic radiation in accordance with the instant invention is a frequency that is capable of liberating charge carriers from chalcogen atoms in a chalcogenide switching material. The frequency may be a frequency absorbed by the chalcogen atom, where absorption leads to the promotion of a lone pair electron from a low energy orbital state to a high energy orbital state or an unbound state. The frequency may be a frequency in resonance with an oscillation frequency of a lone pair electron or an oscillation frequency of the chalcogen atom on which the lone pair electron is localized. The frequency may be a frequency that increases the kinetic energy of existing conductive electrons so that impact ionization of bound lone pair electrons is promoted. The range of frequencies capable of contributing to at least one mechanism for liberating lone pair electrons from bound orbital states generally extends from the far infrared (~10 cm$^{-1}$) to the far ultraviolet (~10$^6$ cm$^{-1}$). The range includes infrared, visible, optical, and ultraviolet frequencies.

A device in accordance with the instant invention includes a non-electrical source of energy in combination with a switching material. The non-electrical source of energy is coupled to the switching material to permit a transfer of energy from the source to the switching material. In one method of the instant invention, a non-electrical form of energy is provided to a switching material to induce a transformation of the switching material from a resistive state to a conductive state.

In another embodiment, the device includes a non-electrical source of energy in combination with a switching material, where the device further includes electrical contacts in electrical communication with the switching material. In another method of the instant invention, a non-electrical electrical form of energy is provided to a switching material to induce a transformation of the switching material from a resistive state to a conductive state, thereby creating a conductive pathway between two or more electrical contacts in electrical communication with the switching material. In still another embodiment, the method includes providing a sub-threshold voltage across a pair of electrical contacts in electrical communication with the switching material and providing a non-electrical form of energy to induce switching. In this embodiment, the sub-threshold voltage is insufficient to initiate a switching transformation and serves as a supplemental source of energy that complements the non-electrical form of energy. The combination of the electrical energy or electric field provided by the sub-threshold voltage and the non-electrical form of energy is sufficient to initiate a switching transformation.

In a further embodiment, the device includes a non-electrical source of energy in combination with a switching material, electrical contacts in electrical communication with the switching material and one or more circuit elements interconnected to the electrical contacts. In a further method of the instant invention, a non-electrical electrical form of energy is provided to a switching material to induce a transformation of the switching material from a resistive state to a conductive state to create a conductive pathway that permits electrical communication between two or more circuit elements interconnected with the electrical contacts of the switching material.

In other embodiments, the instant invention provides methods and devices for controlling the propagation of electromagnetic radiation. Control over the transmission of light, for example, is a central feature of optical communications and optical computing. Optical analogues of electrical circuits rely on the encoding of information in electromagnetic signals instead of electrical signals and require fine control over the routing and transmission of the electromagnetic signals. Optical circuits and optical computers offer the potential of faster speeds and more parallel operation. In order to achieve optical circuits and optical computers, further developments in media and devices capable of transmitting and regulating the direction of propagation and intensity of electromagnetic signals are needed.

As indicated hereinabove, application of an electrical or non-electrical form of energy to a chalcogenide switching material induces a transformation from a resistive state to a conductive state through formation of a conductive filament created by liberating lone pair electrons from bound orbital states. In the filament, electrons from the lone pair orbitals are mobile and have a continuum of energy states available to them. The collection of conductive filamentary electrons accordingly is capable of absorbing and/or reflecting electromagnetic radiation. In practice, free carrier absorption is intense and provides for effective filtering or rejection of electromagnetic energy within the absorbed range. The typical range of free carrier absorption extends from 100 cm$^{-1}$ (wavelength of 100 μm) to 10,000 cm$^{-1}$ (wavelength of 1 μm). This range corresponds generally to the far-infrared through near-infrared portions of the electromagnetic spectrum.

In this embodiment, a switching material is transformed to its conductive state through application of an electrical or non-electrical form of energy to generate free carriers that are capable of absorbing or reflecting one or more frequencies of electromagnetic radiation in the far-infrared through near-infrared portion of the spectrum. When switched to the conductive state, the switching material inhibits transmittance of wavelengths at these one or more frequencies. In one embodiment, the switching material reflects one or more frequencies of incident electromagnetic radiation in the far-infrared through near-infrared portion of the spectrum. In another embodiment, the switching material absorbs one or more frequencies of incident electromagnetic radiation in the far-infrared through near-infrared portion of the spectrum.

The instant invention provides methods for controlling the direction of propagation of electromagnetic radiation. One method includes directing an electromagnetic beam toward a switching material and redirecting the electromagnetic beam by applying an electrical or non-electrical form of energy to the switching material to generate free carriers that reflect the electromagnetic beam. The method permits reversible reflection of the electromagnetic beam by toggling the switching material between its resistive (low reflectivity) and conductive (high reflectivity) states.

Another method includes directing an electromagnetic beam toward a switching material and attenuating or extinguishing the electromagnetic beam by applying an electrical or non-electrical form of energy to the switching material to generate free carriers that absorb the electromagnetic beam. The method permits reversible attenuation or extinguishing of the electromagnetic beam by toggling the switching material between its resistive (low absorbance) and conductive (high absorbance) states.

The reflection and absorbance characteristics of the conductive state of a switching material in accordance with the instant invention enable reflective devices and attenuation devices that may be used to control the direction of propagation and/or intensity of propagated electromagnetic radiation. In one embodiment, a device includes an electrical or non-electrical source of energy and a switching material and functions as a reflector (e.g. mirror) when the switching material is in its conductive state to redirect the direction of propagation of an electromagnetic beam. The degree of reflection may be controlled through the concentration of free carriers created during the switching transformation. As described hereinabove, the conductive state of a switching material includes a conductive filament comprised of free carriers where the cross-section of the filament can be controlled by varying the amount of energy delivered by the electrical or non-electrical source of energy to the switching material. When the conductive filament is narrow, the number of free carriers is low and the degree of reflection is low. As more energy is applied to the switching material and more lone pair electrons are excited from bound orbital states to a mobile, unbound state, the conductive filament expands and a greater degree of reflectivity results. This embodiment thus comprehends full and partial reflection of a range of electromagnetic frequencies and further comprehends a method whereby a portion of an incident electromagnetic beam is reflected by the switching material and a portion of the incident electromagnetic beam is transmitted by the switching material. The reflection device of this embodiment may further include one or more optical fibers or optical circuits interconnected with the switching material that deliver the electromagnetic beam to the switching material or that receive the redirected or transmitted electromagnetic beam from the switching material.

In another embodiment, a device includes an electrical or non-electrical source of energy and a switching material and functions as an electromagnetic filter (e.g. bandpass filter) when the switching material is in its conductive state to block one range of electromagnetic frequencies and transmit another range of electromagnetic frequencies. The blocked frequencies may be absorbed or reflected by the switching material. The electromagnetic filter may further include one or more optical fibers or optical circuits interconnected with the switching material that deliver the electromagnetic beam to the switching material or that receive the transmitted (or redirected) electromagnetic beam from the switching material.

In a further embodiment, a device includes an electrical or non-electrical source of energy and a switching material and functions as an attenuator (e.g. neutral density filter) to reduce the transmitted intensity of a range of electromagnetic frequencies through absorption by free carriers present in the conductive state. In this embodiment, the degree of attenuation is controlled by the number of free carriers supported by the conductive state of the switching material. As described hereinabove, the number of free carriers is a function of the cross-sectional area of the conductive filament and may be controlled by varying the amount of energy delivered by the electrical or non-electrical source to the switching material. The attenuator may further include one or more optical fibers or optical circuits interconnected with the switching material that deliver the electromagnetic beam to the switching material or receive an attenuated transmitted electromagnetic beam from the switching material.

Those skilled in the art will appreciate that the methods and designs described above have additional applications and that the relevant applications are not limited to those specifically recited above. Also, the present invention may be embodied in other specific forms without departing from the essential characteristics as described herein. The embodiments described above are to be considered in all respects as illustrative only and not restrictive in any manner.

I claim:

1. A method of operating a switching material comprising:
providing a switching material, said switching material having a resistive state, a conductive state and a structural phase, said switching material comprising four or more elements;
providing non-electrical energy to said switching material, said non-electrical energy inducing a transformation of said switching material from said resistive state to said conductive state, said non-electrical energy not altering said structural phase during said transformation.

2. The method of claim 1, wherein said switching material is a threshold switching material.

3. The method of claim 1, wherein said switching material comprises a chalcogenide material.

4. The method of claim 3, wherein said chalcogenide material comprises Te or Se.

5. The method of claim 4, wherein the atomic concentration of said Te or Se is at least 30%.

6. The method of claim 5, wherein the atomic concentration of said Te or Se is at least 50%.

7. The method of claim 4, wherein said chalcogenide material further comprises Ge or In.

8. The method of claim 7, wherein said chalcogenide material further comprises Si, Sb or As.

9. The method of claim 1, wherein said structural phase is an amorphous phase.

10. The method of claim 1, wherein said non-electrical energy is electromagnetic energy.

11. The method of claim 10, wherein said electromagnetic energy has a wavelength between 100 µm and 1 µm.

12. The method of claim 10, wherein said electromagnetic energy has a wavelength of less than 1 µm.

13. The method of claim 1, wherein said transformation comprises forming a conductive filament within said switching material, said switching material including a first portion and a second portion, said conductive filament occupying said first portion, said switching material being in said resistive state in said second portion.

14. The method of claim 13, wherein said conductive filament comprises unbound electrons, said unbound electrons being removed from bound orbital states by said non-electrical energy.

15. The method of claim 14, wherein said bound orbital states are lone pair states.

* * * * *